US006779166B2

(12) United States Patent
Vidhani (10) Patent No.: US 6,779,166 B2
(45) Date of Patent: Aug. 17, 2004

(54) OPTIMAL ALTERNATING POWER AND GROUND SHIELD ASSIGNMENT ALGORITHM

(75) Inventor: Devendra Vidhani, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/238,550

(22) Filed: Sep. 10, 2002

(65) Prior Publication Data

US 2004/0049757 A1 Mar. 11, 2004

(51) Int. Cl.$^7$ ................................................. G06F 9/45
(52) U.S. Cl. ........................... 716/12; 716/5; 716/13; 716/14
(58) Field of Search ........................ 716/4–8, 10, 12, 716/14, 15, 19, 20; 438/773; 361/794, 774, 111; 345/421; 257/758, 532, 508, 500

(56) References Cited

U.S. PATENT DOCUMENTS

| 5,061,979 A | * | 10/1991 | Kobayashi et al. ......... 136/244 |
| 5,721,660 A | * | 2/1998 | Mizobe et al. .............. 361/111 |
| 5,774,696 A | * | 6/1998 | Akiyama ..................... 716/20 |
| 5,831,870 A | * | 11/1998 | Folta et al. .................... 716/5 |
| 6,348,722 B1 | * | 2/2002 | Yoshikoshi ................. 257/508 |
| 6,396,150 B2 | * | 5/2002 | Kohno ........................ 257/758 |
| 6,510,545 B1 | * | 1/2003 | Yee et al. ..................... 716/12 |
| 2002/0076941 A1 | * | 6/2002 | Ushiyama et al. .......... 438/773 |
| 2002/0195678 A1 | * | 12/2002 | Watanabe et al. ........... 257/500 |
| 2003/0133277 A1 | * | 7/2003 | Saijo et al. .................. 361/774 |

FOREIGN PATENT DOCUMENTS

JP      07320799    *  5/1994    ............ H01R/9/05

OTHER PUBLICATIONS

Yook et al., "RLC signal integrity analysis of high–speed global interconnects [CMOS]", Dec. 2000, Electron Devices Meeting, 2000. IEDM Technical Digest. International, 10–13, pp.: 731–734.*
G.S. Yee et al.; An Automated Shielding algorithm and Tool for Dynamic Circuits', International Symposium on Quality in Electronic Design, Mar. 2000, pp. 369–374.
P. Berman et al.; "Optimal Phase Conflict Removal for Layout of Dark Field Alternating Phase Shifting Masks", IEEE Trans. on CAD 19(2), (2000), pp. 175–187.
A. B. Kahng et al., "Automated Layout and Phase Assignment Techniques for Dark Field Alternating PSM", Proc. 18th BACUS Symposium on Photomask Technology and Management, Sep. 1998, pp. 222–231.
P. Berman et al., "Optical Phase Conflict Removal for Layout of Dark Field Alternating Phase Shifting Masks", Proc. ACM Intl: Symp. on Physical Design, Apr. 1999, pp. 121–126.
P. Berman et al.; "The T–Join Problem in Sparse Graphs: Applications to Phase Assignment Problem in VLSI Mask Layout", Tue., Nov. 20, 2001 22:39:01 GMT http://visica-d.ucsd.edu/conference.html., pp. 1–12.

* cited by examiner

*Primary Examiner*—Leigh M. Garbowski
*Assistant Examiner*—Helen B Rossoshek
(74) *Attorney, Agent, or Firm*—Osha & May L.L.P.

(57) ABSTRACT

A method for facilitating the assignment of alternating voltage potentials to a set of shield wires in a routing layer of an integrated circuit involves generating a set of vertices representing at least a portion of the set of shield wires and of edges representing adjacency of at least the portion of the set of shield wires, minimizing a set of edges in the set of vertices to obtain a minimized set of vertices, and assigning a first indicator to one vertex of the minimized set of vertices.

25 Claims, 9 Drawing Sheets

OPTIMAL ALTERNATING POWER AND GROUND SHIELD ASSIGNMENT ALGORITHM

BACKGROUND OF THE INVENTION

Figure 1:
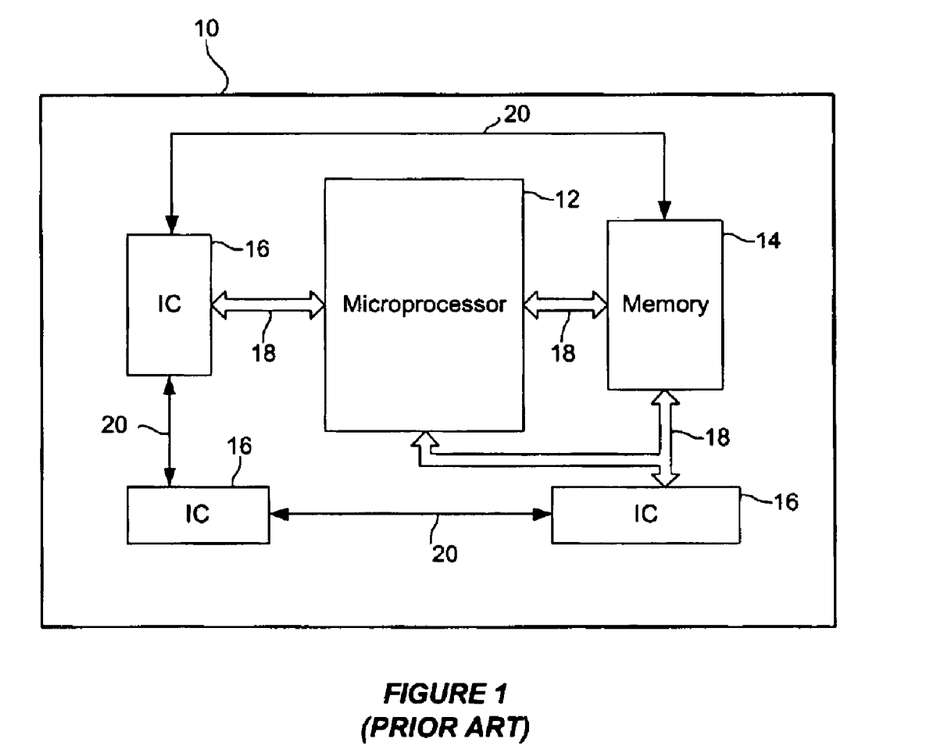
FIG. 1 shows a typical computer system.

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (IC) (16) that have various functionalities, and communication paths (18, 20), i.e., buses and wires, that are necessary for the transfer of data among the aforementioned components of the computer system (10).

Microprocessors are often fabricated on an integrated circuit (IC). Because signal wires within an IC are often in close proximity to each other, the signal wires have a propensity to affect the behavior of each other. This occurs due to intrinsic capacitances (also referred to and known as "cross-coupling capacitance") that are formed between signal wires operating at different voltage levels.

Figure 2:
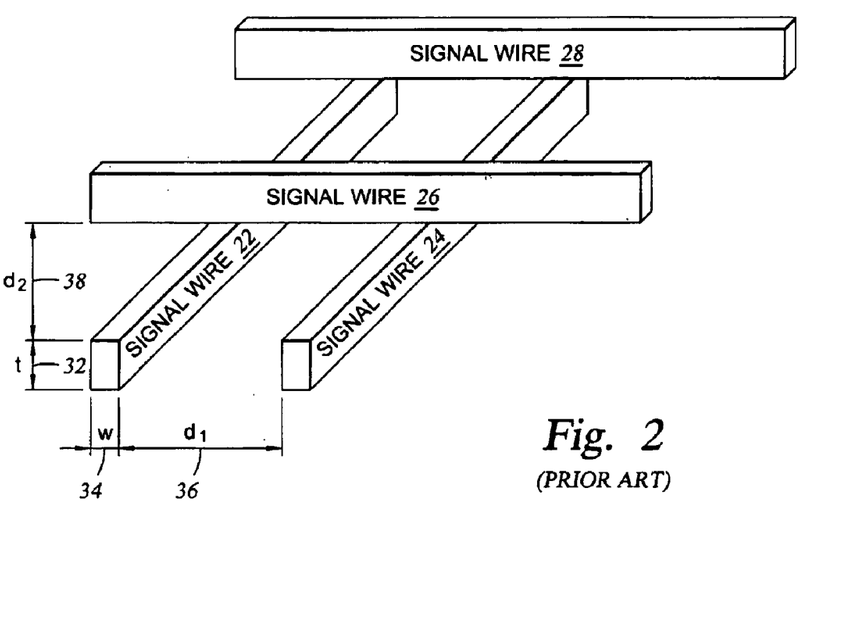
FIG. 2 shows a typical routing of signal wires.

FIG. 2 shows a typical routing of signal wires. The routing of signal wires includes signal wires (22, 24, 26, 28). Signal wires (22, 24) are located in a first routing layer and signal wires (26, 28) are located in a second routing layer. Some amount of cross-coupling capacitance is likely to be formed between signal wire (22) and signal wire (24) because they are located relatively close to one another in the first routing layer. Similarly, in the second routing layer, the signal wire (26) and the signal wire (28) develop some amount of cross coupling capacitance. If a voltage on the signal wire (22) changes, the cross-coupling capacitance will have a tendency to affect the signal on the signal wire (24). For example, when the voltage is raised on the signal wire (22), i.e., transitions to a "logic high," the cross coupling capacitance tends to raise the voltage on the signal wire (24). When the voltage is reduced on the signal wire (22), i.e., transition to a "logic low," the cross coupling capacitance tends to reduce the voltage on the signal wire (24). In other words, when the signal wire (22) switches state, noise may be injected on the signal wire (24) that causes the signal on signal wire (24) to glitch, i.e., an electrical spike occurs. Signal wire (24) may also adversely affect the signal on signal wire (22). Further, cross-coupling capacitance may affect signal wires (26, 28) in the second routing layer in a similar manner.

Noise affects may be increased through other factors. For example, referring to FIG. 2, the thickness t (32) of the signal wire (22) is greater than the width w (34) of the signal wire (22), and the distance, d1 (36), is often smaller than the distance between adjacent layers, d2 (38). The dimensions of the wires and the amount of overlap of the wires between routing layers also increases the cross coupling capacitance because cross-coupling capacitance between adjacent wires, e.g., signal wire (22) and signal wire (24), is larger than the cross-coupling capacitance between wires in different routing layers, e.g., signal wire (22) and signal wire (26).

Noise is also produced due to increased processing speeds. As the rise times (or equally, fall times) of signals decrease, the rapid change in voltage differences increase the amount of noise. The noise injected on a non-switching signal can propagate to other parts of the processor. Such undesired behavior on any signal may lead to performance degradation causing timing failures and/or circuit malfunction.

Figure 3:
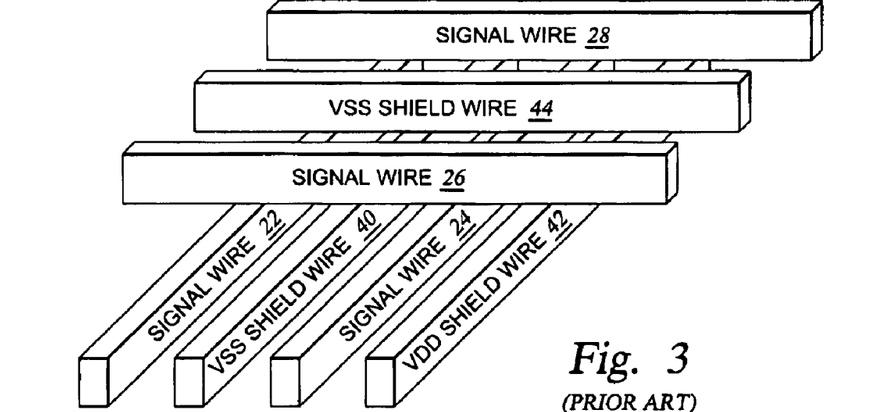
FIG. 3 shows a typical routing of shield wires for the routing of signal wires shown in FIG. 2.

There are several approaches that designers have used to combat noise caused by cross-coupling capacitance. For example, designers have increased the wiring spacing and added shield wires between signal wires. When adding shield wires, the shield wires are typically at a constant voltage. To this end, FIG. 3 shows a typical routing of shield wires for the routing of signal wires shown in FIG. 2. In FIG. 3, a shield wire (40) at logic low is placed between signal wire (22) and signal wire (24). A shield wire (42) at logic high is placed adjacent to the signal wire (24). Further, a shield wire (44) at logic low is placed in between signal wire (26) and signal wire (28). Because of the routing of shield wires as shown in FIG. 3, other signals in close proximity to the signal wire (24) are not affected significantly by the switching behavior of the signal wire (24) due to the fact that the signal wire (24) is shielded by shield wires (40, 42) that have constant values. Alternatively, the routing of shield wires (40, 42) lessens the effects of the switching behavior of other signals, e.g., signals on signal wires (22, 26, 28) that are in close proximity to the signal wire (24).

Shield wires are typically implemented such that a shield wire at logic high and a shield wire at logic low shield the signal wire. Shield wires implemented in this manner are termed "alternating shield wires." In FIG. 3, assigning shield wires (40, 42, 44) to alternating voltage potentials is a relatively simple task because there are only a few signal wires and the routing of the signal wires is not complex. However, when there is a large number of signal wires and there is sophisticated and complex routing, a greater number of shield wires is required, which in turn makes the process of assigning shield wires in a routing layer more complex.

SUMMARY OF INVENTION

In general, one aspect of the invention involves a method for facilitating the assignment of alternating voltage potentials to a set of shield wires in a routing layer of an integrated circuit. The method comprises generating vertices representing the set of shield wires: dependent on the routing layer, generating edges between the vertices, the edges representing adjacency of the set of shield wires; determining whether any assignment of voltage potentials to the vertices results in an arrangement in which at least one of the edges is positioned between vertices of the same voltage potential; dependent on the determining, selectively minimizing the edges to obtain a minimized arrangement of edges and vertices; and assigning a first indicator to at least one vertex in the minimized arrangement.

In general, in one aspect the invention involves a computer system to transform a behavioral specification. The computer system comprises a computer-readable medium having recorded thereon instructions by a processor to perform an assignment of alternating voltage potentials to a set of shield wires in a routing layer to of an integrated circuit. The instructions are for: generating vertices representing the set of shield wires; dependent on the routing layer, generating edges between the vertices, the edges representing adjacency of the set of shield wires; determining whether any assignment of voltage potentials to the vertices results in an arrangement in which at least one of the edges is positioned between vertices of the same voltage potential: dependent on the determining, selectively minimizing the edges to obtain a minimized arrangement of edges and vertices; and assigning a first indicator to at least one vertex in the minimized arrangement.

In general, in one aspect the invention involves a computer system that determines alternating voltage potentials to a set of shield wires in a routing layer of an integrated circuit. The computer system comprises a processors a memory, a display device, and software instructions stored in the memory for enabling the computer system under control of the processor, to perform: generating vertices representing the set of shield wires; dependent on the routing layer, generating edges between the vertices, the edges representing adjacency of the set of shield wires; determining whether any assignment of voltage potentials to the vertices results in an arrangement in which at least one of the edges is positioned between vertices of the same voltage potential; dependent on the determining, selectively minimizing the edges to obtain a minimized arrangement of edges and vertices; and assigning a first indicator to at least one vertex in the minimized arrangement.

In general, one aspect of the invention involves a method for assigning alternating voltage potentials to a set of shield wires in a routing layer of an integrated circuit. The method comprises: a step for generating vertices representing the set of shield wires; dependent on the routing layer, a step for generating edges between the vertices, the edges representing adjacency of the set of shield wires; a step for determining whether any assignment of voltage potentials to the vertices results in an arrangement in which at least one of the edges is positioned between vertices of the same voltage potential; dependent on the determining, a step for selectively minimizing the edges to obtain a minimized arrangement of edges and vertices; and a step for assigning a first indicator to at least one vertex in the minimized arrangement.

In general, one aspect of the invention involves a an apparatus for assigning alternating voltage potentials to a set of shield wires in a routing layer of an integrated circuit. The apparatus comprises: means for generating vertices representing the set of shield wires; dependent on the routing layer, means for generating edges between the vertices, the edges representing adjacency of the set of shield wires; means for determining whether any assignment of voltage potentials to the vertices results in an arrangement in which at least one of the edges is positioned between vertices of the same voltage potential; dependent on the determining, means for selectively minimizing the edges to obtain a minimized arrangement of edges and vertices; and means for assigning a first indicator to at least one vertex in the minimized arrangement.

Other aspects and advantages of the invention will be apparent from the following description and the appended claims.

DETAILED DESCRIPTION

Specific embodiments of the invention will now be described in detail with references to the accompanying figures. Like elements in the various figures are denoted by like reference numerals throughout the figures for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 4:
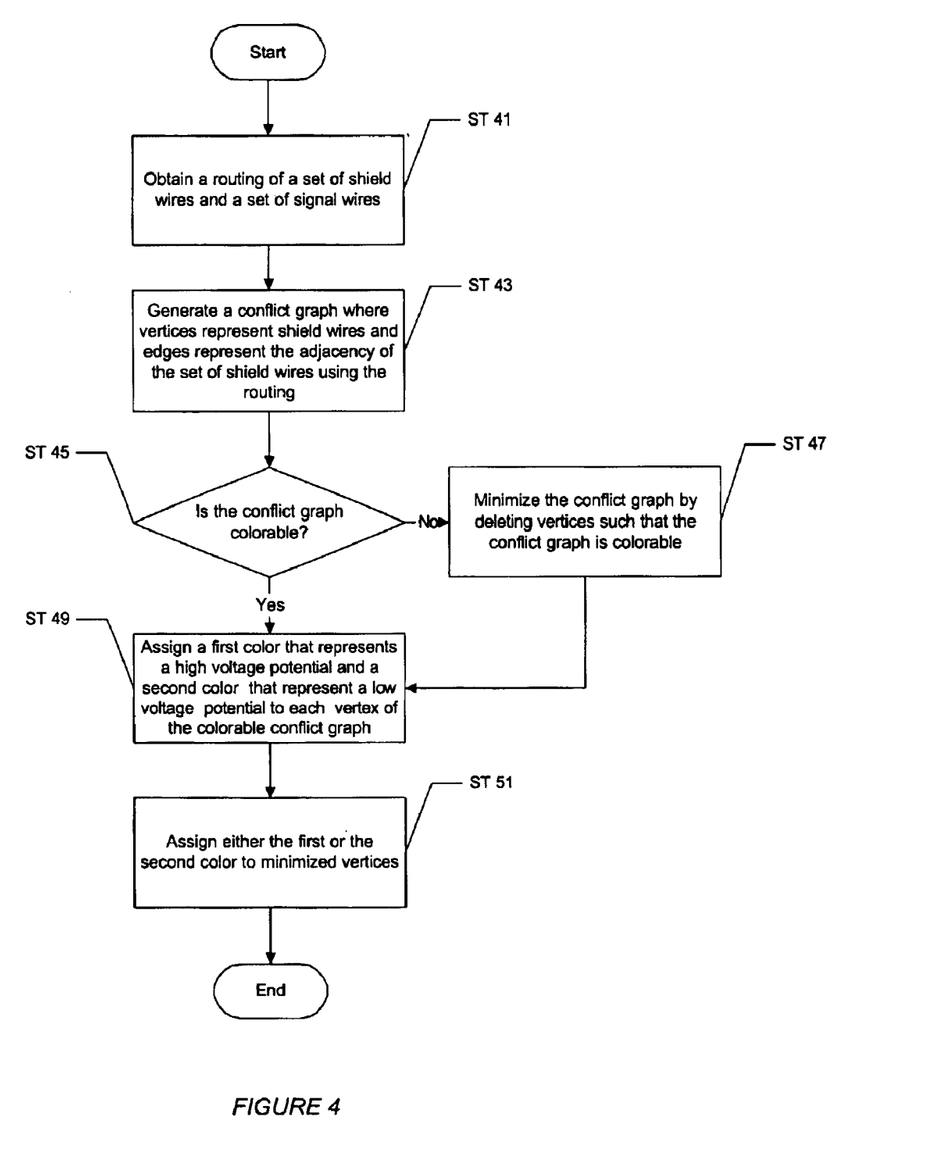
FIG. 4 shows a flow diagram of the process for assigning alternating voltage potentials shield wires to alternating potentials using a conflict graph in accordance with an embodiment of the present invention.
Figure 5:
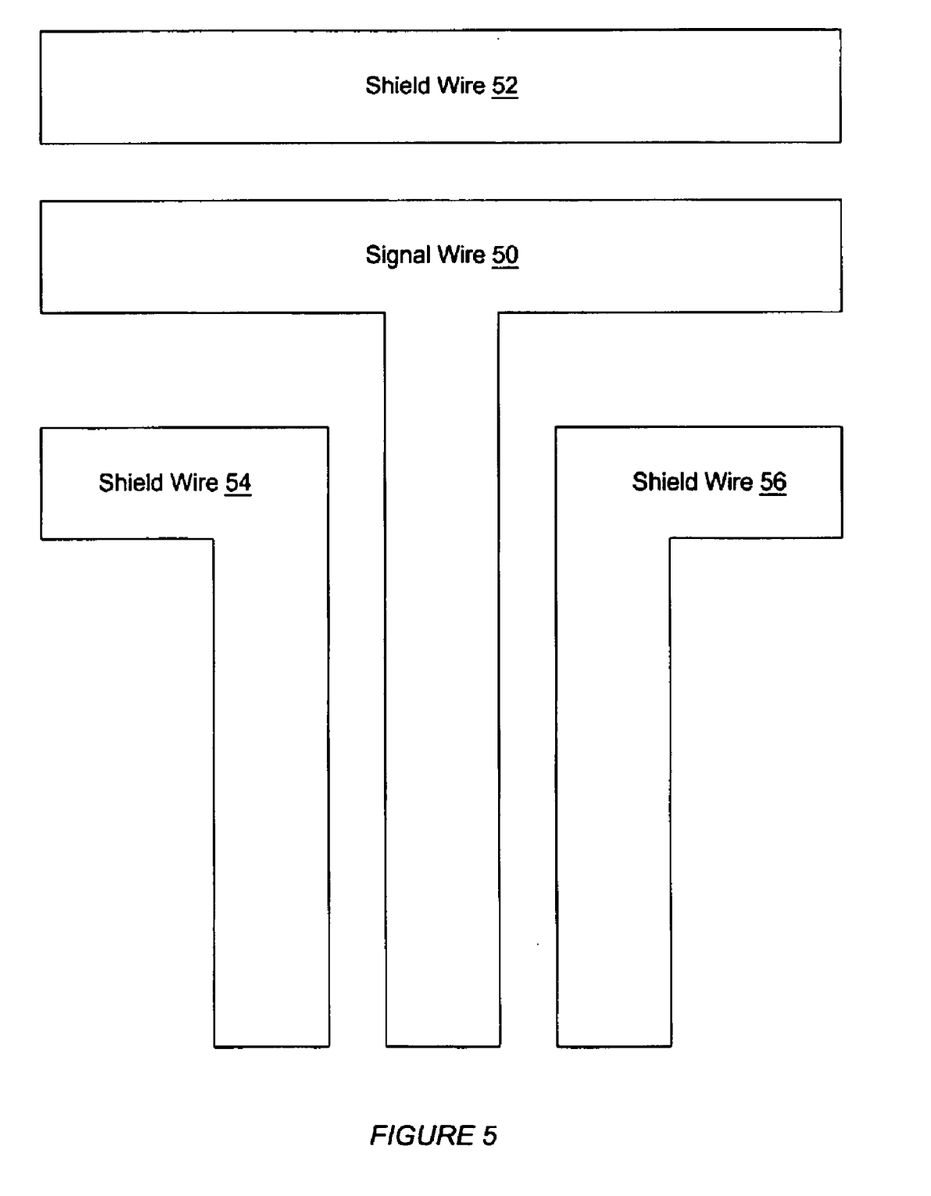
FIG. 5 shows a routing of shield wires and signal wires in accordance with an embodiment of the present invention.

Embodiments of the invention relate to a method for assigning alternating voltage potentials to a routing of shield wires in a routing layer using a conflict graph. FIG. 4 shows an exemplary flow diagram of a process for assigning alternating voltage potentials to shield wires in a routing layer using a conflict graph in accordance with an embodiment of the invention. Initially, a routing of shield wires and signal wires is obtained (Step 41). In one or more embodiments, a schematic defining the connectivity of components within an IC is used input to a routing tool to generate a routing of signal wires and shield wires. FIG. 5 shows an exemplary routing of shield wires and signal wire in accordance with an embodiment of the present invention. The routing includes shield wires (52, 54, 56) and signal wire (50). The routing of the shield wires and signal wire may be found in a first routing layer of an IC. Shield wires (52, 54, 56) shield signal wire (50) from interference of other signal wires in close proximity to signal wire (50) (not shown).

Referring again to FIG. 4, in Step 43, a conflict graph of vertices and edges is generated using the routing from Step 41. The conflict graph is an abstraction of a set of items that are represented as a set of vertices and edges, where each vertex represents an item and each edge represents a possible conflict between two items. With regard to assigning the shield wires using the conflict graph, each vertex represents a shield wire and each edge represents the adjacency between two shields. Furthermore, the edge represents possible conflicts between adjacent shield wires of alternating voltage potentials.

In one or more embodiments of the present invention, a definition of adjacency between a signal wire and shield, and between two shield wires, may be as follows. A shield wire and a signal wire are said to be adjacent if there are some segments of the signal wires and the shield wire that are separated by spacing alone and are not separated by other shield wire or signal wire. Further, two shield wires are said to be adjacent if the two shield wires have a common signal wire adjacent to them at some common point on the signal wire segment.

Figure 6:
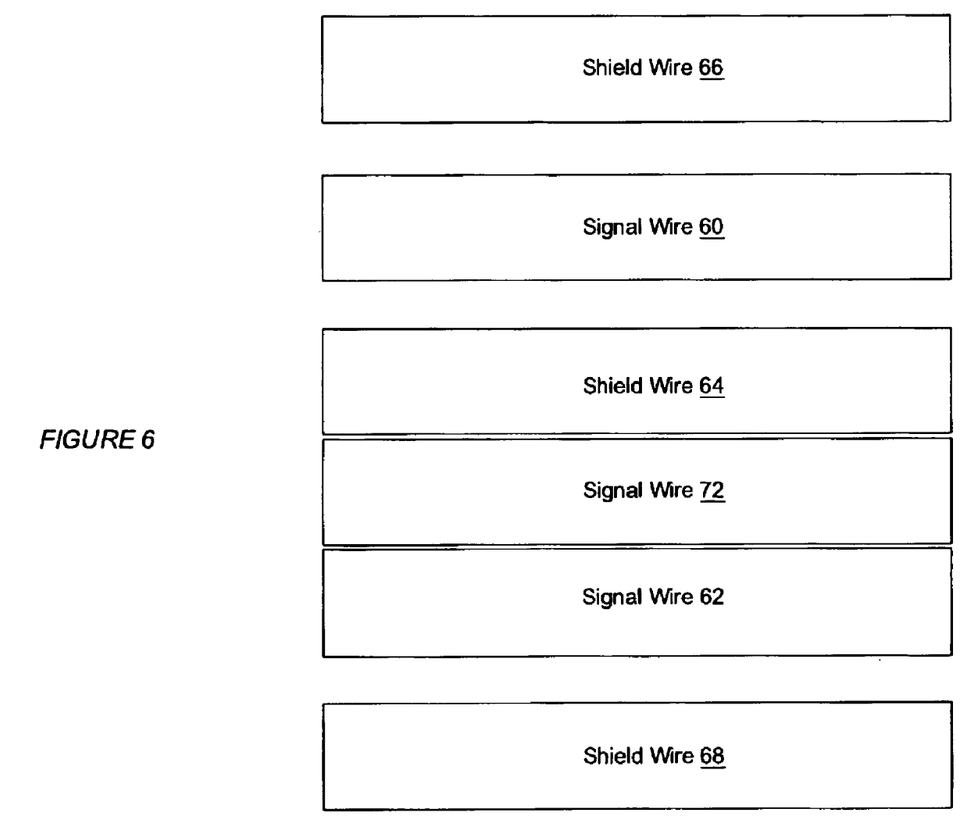
FIG. 6 shows a routing of shield wires and signal wires for defining shield wire adjacency in accordance with an embodiment of the present invention.

FIG. 6 shows an exemplary routing of shield wires and signal wires for defining shield wire adjacency in accordance with an embodiment of the invention. The routing of shield wires and signal wires includes shield wires (64, 66, 68) and signal wires (60, 62, 72). In the present example, shield wires (64, 66) shield signal wire (60) and shield wire (68) shields signal wire (62). Accordingly, shield wires (64, 66) are said to be adjacent to shield wire (60). Shield wire (68) is said to be adjacent to signal wire (62) and shield wire (64) is said to be adjacent to signal wire (72). Shield wire (64), however, is not considered adjacent to signal wire (62) as there is a signal wire (72) separating the shield wire (64) and signal wire (62). Additionally, shield wires (64, 66) are considered adjacent, whereas shield wires (64, 68) are not adjacent, as shield wires (64, 68) do not share in adjacency to the signal wire (62).

Figure 7:
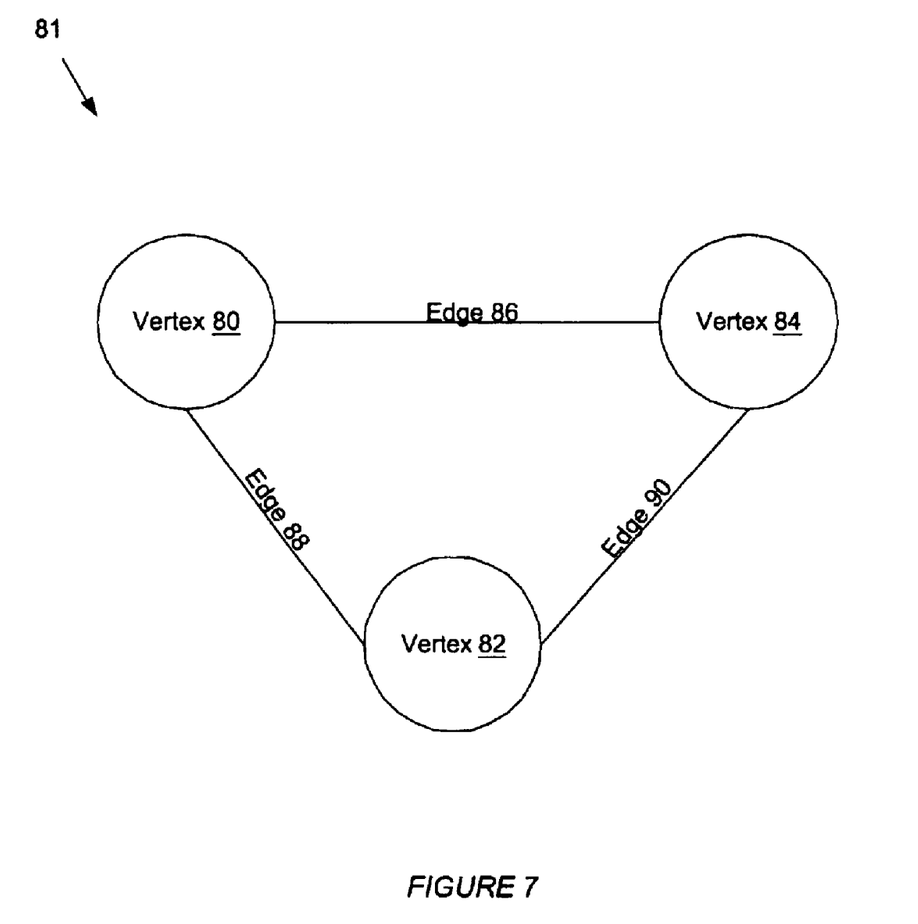
FIG. 7 shows a conflict graph of the routing of shield wires and signal wires shown in FIG. 5.

Applying the previously discussed definition of shield wire adjacency, the adjacency between the shield wires shown in FIG. 5 may be determined. Referring to FIG. 5, shield wires (52, 54, 56) are adjacent to signal wire (50), and further, shield wires (52, 54, 56) are adjacent to each other. To this end, the conflict graph shown in FIG. 7 may be generated. FIG. 7 shows an exemplary conflict graph of the routing of shield wires (52, 54, 56) and signal wire (50) in FIG. 5 in accordance with an embodiment of the present invention. The conflict graph (81) includes three vertices (80, 82, 84) and three edges (86, 88, 90). Each vertex corresponds to each shield and each edge corresponds to the adjacency between two shields wires. Therefore, vertices (80, 82, 84) represent shield wires (52, 56, 54), respectively, and thus, edge (86) represents adjacency between the shield wires (52, 54), edge (88) represents adjacency between shield wires (52, 56), and edge (90) represents adjacency between shield wires (54, 56).

Referring to FIG. 4, if the conflict graph is two-colorable (Step 45), then a first color or other indicator representing a high voltage potential is assigned, or a second color or other indicator representing a low voltage potential is assigned to each vertex of the colorable conflict graph (Step 49). "Colorability" is the determination of whether the conflict graph is bipartite, i.e., no odd cycles, or two-colorable (Step 47). In other words, a conflict graph is "colorable" if no two vertices of the same color are connected by an edge.

Figure 8:
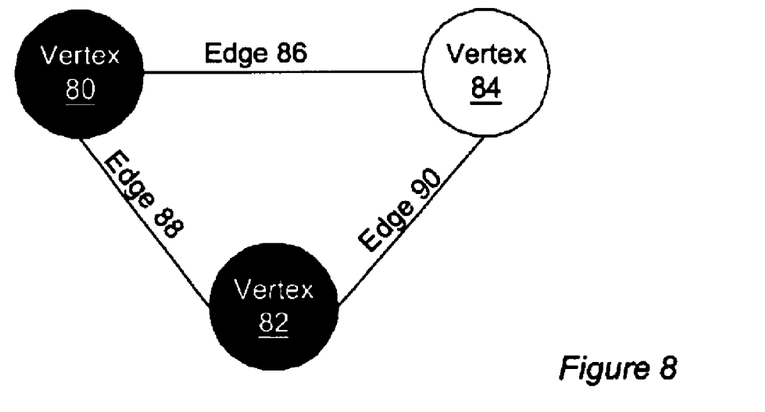
FIG. 8 shows vertices of the conflict graph shown in FIG. 7 in which the vertices are assigned two colors in accordance with an embodiment of the present invention.
Figure 9:
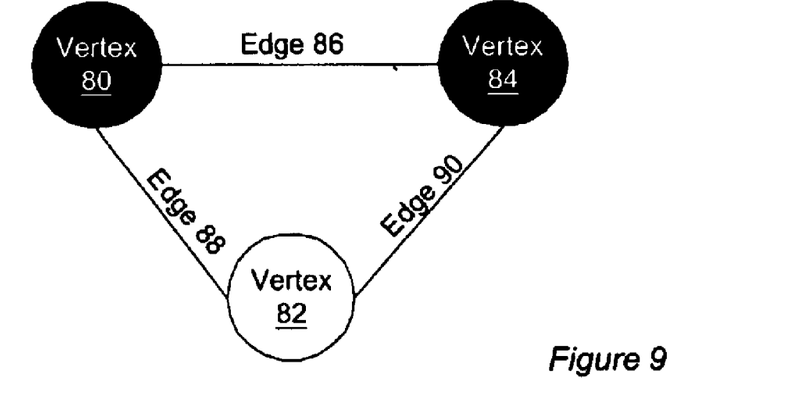
FIG. 9 shows vertices of the conflict graph shown in FIG. 7 in which the vertices are assigned two colors in accordance with an embodiment of the present invention.
Figure 10:
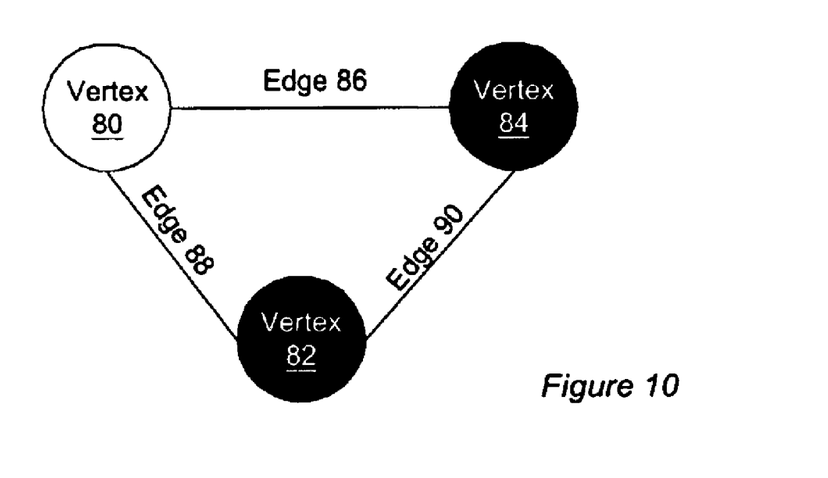
FIG. 10 shows vertices of the conflict graph shown in FIG. 7 in which the vertices are assigned two colors in accordance with an embodiment of the present invention.

FIGS. 8, 9, and 10 show the vertices of the exemplary conflict graph in FIG. 7 in which vertices are assigned two colors in accordance with an embodiment of the present invention. FIGS. 8, 9, and 10, provide a set of different possible ways to color the conflict graph (81) using two colors. The edges of conflict graph (81) must maintain alternating colors on the vertices to be considered colorable. With respect to the permutations shown in FIGS. 8, 9, and 10, conflict graph (81) shown in FIG. 7 is not colorable, i.e., there is no coloring of vertices that does not allow an edge to connect two vertices of the same color. That is conflict graph (81) shown in FIG. 7 is not bipartite. This means that the conflict graph (81) maintains odd cycles.

Referring back to Step 45 in FIG. 4, the conflict graph is not colorable; therefore, the conflict graph is minimized by deleting one or more edges such that the conflict graph is colorable. There are a variety of ways in which the conflict graph may be minimized, e.g., transforming the minimization of a conflict graph to a T-join implementation for planar graphs using a minimum distortion technique, a minimum-weight perfect matching technique, etc.

In one or more embodiments of the present invention, the conflict graph is transformed to the T-join implementation using the minimum distortion technique. In the present case, each edge is assigned a weight based on various factors. These factors may include, but are not limited to the length of signal wire, the driver of the signal wire, the distance for which adjacency exists etc. If the signal wire is driven a relatively longer distance, shielding may be more desirable as to maintain the integrity of the signal on the signal wire, and thus, the adjacency between signal wires may be given a heavier weight. Additionally, if the driver of a signal on a signal wire is weak, shielding may be more desirable as the introduction of even a small amount of noise may disrupt the signal; and thus, the adjacency between signal wires may be given a heavier weight.

The conflict graph with the weighed edges is minimized such that a generated colorable graph is bipartite and the edges of minimum cost (relatively smaller weights) are deleted. If the edge is deleted, the vertices associated with the edge are no longer assigned alternating colors. Thus, the corresponding shields are no longer assigned alternating high or low voltage potentials.

Figure 11:
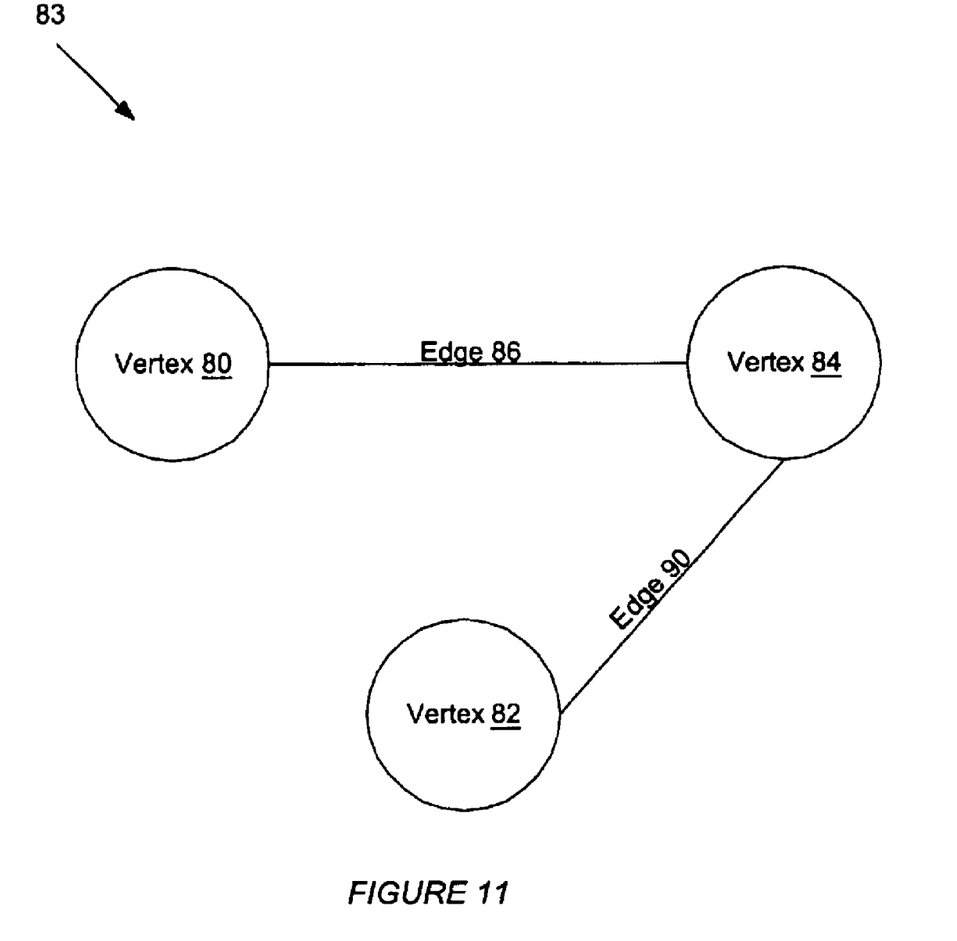
FIG. 11 shows the colorable conflict graph shown in FIG. 7 in which a minimum cost edge is deleted in accordance with an embodiment of the present invention.

Applying a minimization technique to the conflict graph (81) shown in FIG. 7 results in the colorable conflict graph (83) shown in FIG. 11. FIG. 11 shows the colorable conflict graph of FIG. 7 in which a minimum cost edge is deleted in accordance with an embodiment of the present invention. Assuming that shields wires (54, 56) in FIG. 5 are more integral to the proper function of the IC, the edge (90) is assigned a larger weight. Also assuming the shields wires (52, 54) are shielding the signal wire (50) for a longer distance, the edge (86) is assigned a weight less than that of edge (90) but a weight greater than the weight of edge (88). Therefore, the edge (88) is deleted because the edge (88) has the smallest weight. Accordingly, the vertices (80, 82) may not be assigned alternating colors. The corresponding shield wires (52, 56) may not be assigned alternating voltage potentials.

In FIG. 11, assigning a color to the remaining vertex (84), i.e., the vertex (84) of the colorable conflict graph (83), is apparent and does not impact the assignment of other vertices. Given a more complex routing of shield wires and signal wires, however, many shield wires may need to be assigned even after the colorable graph is generated. In Step 49 of FIG. 4, a first color representing a high voltage potential or a second color representing a low voltage potential is assigned to each vertex of the colorable graph. The colorable graph may be assigned in a variety of ways, e.g., depth-first search technique, breadth-first search technique, etc.

In one or more embodiments of the present invention, a breadth-first search technique is used to assign one of two colors to each vertex. The breadth-first search arbitrarily starts at a vertex and assigns a first color. The distance (based on the weight of the edge between vertices) between the arbitrarily chosen vertex and another vertex is determined. If the distance between the two vertices is even, then the vertex is assigned the first color. Otherwise, the vertex is assigned the second color.

Figure 12:
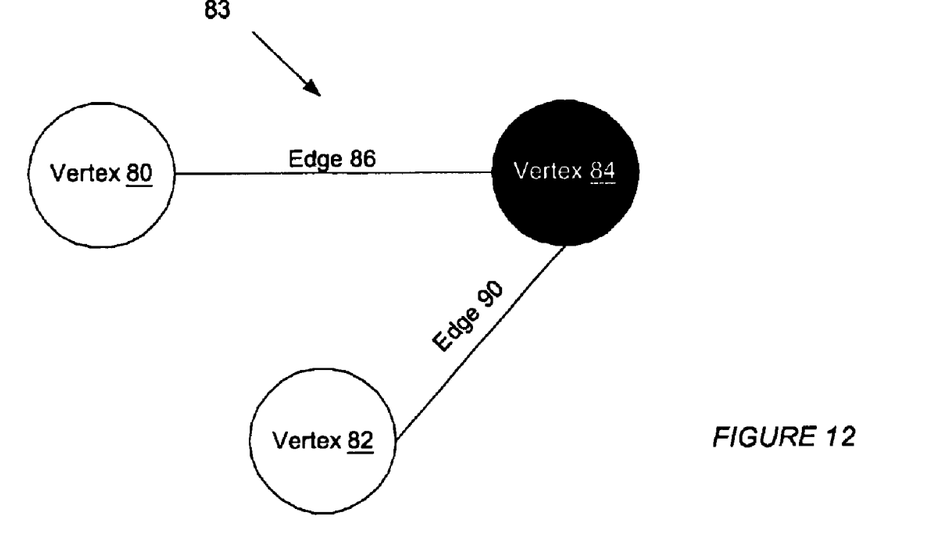
FIG. 12 shows the colorable conflict graph shown in FIG. 11 with each vertex assigned a color in accordance with an embodiment of the present invention.
Figure 13:
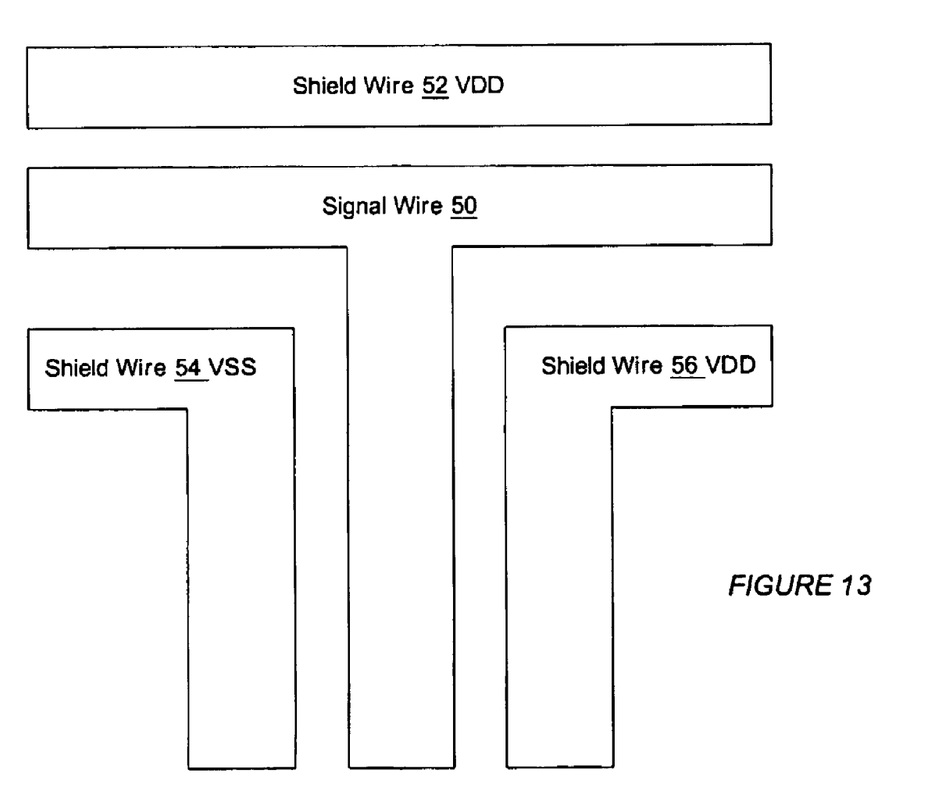
FIG. 13 shows the routing shown in FIG. 5 with each shield wire assigned a voltage potential using the colorable conflict graph in accordance with an embodiment of the present invention.

Once the vertices of the colorable graph are assigned, the vertices associated with deleted edges which are not yet colored are assigned the first color or the second color (Step 51). FIG. 12 shows an exemplary colorable conflict graph shown in FIG. 11 with each vertex assigned a color in accordance with an embodiment of the present invention. The vertex (84) is colored and the remaining the vertices (80, 82) are colored the second color. The vertices (80, 82) may maintain the same color as no edge connects the vertices (80, 82). Assuming the black vertex represents the high voltage potential and the white vertices represent the low voltage potential, the shield wires (52, 54, 56) shown in FIG. 5 may be assigned as shown in FIG. 13. Shield wire (54) is assigned high voltage potential and shield wires (52, 56) are assigned low voltage potentials. One skilled in the art can understand that each color may correspond to high and low voltage potentials conversely.

The previously discussed process for assigning alternating potentials to shield wires using a conflict graph is for one routing layer. One skilled in the art will understand that the process may be applied to multiple routing layers of an IC. Therefore, a conflict graph may be generated representing shield wires for multiple routing layers, in this manner alternating voltage potentials may be assigned to shield wires in multiple routing layers within an integrated circuit.

Advantages of embodiments of the present invention may include one or more of the following. The routing of signal wires and shield wires can be represented as a conflict graph. The adjacency between shield wires and signals wires and between two shield wires can be determined. A conflict graph can be efficiently minimized as a colorable conflict graph. Efficient assignment of alternating voltage potentials to shield wires in a routing layer can be achieved. The assignment of alternating voltage potentials to shield wires for multiple routing layers is facilitated.

While the invention has been described with respect to a limited number of embodiments, one skilled in the art, having benefit of this disclosure, can appreciate that other embodiments can be devised which do not depart from the scope of the invention as disclosed herein. Accordingly, the scope of the invention should be limited only by the attached claims.

What is claimed is:

1. A method for facilitating the assignment of alternating voltage potentials to a set of shield wires in a routing layer of an integrated circuit, comprising:
    generating vertices representing the set of shield wires;
    dependent on the routing layer, generating edges between the vertices, the edges representing adjacency of the set of shield wires;
    determining whether any assignment of voltage potentials to the vertices results in an arrangement in which at least one of the edges is positioned between vertices of the same voltage potential;
    dependent on the determining, selectively minimizing the edges to obtain a minimized arrangement of edges; vertices and
    assigning a first indicator to at least one of the vertex in the minimized arrangement.

2. The method of claim 1, wherein the first indicator represents a first voltage potential.

3. The method of claim 1, wherein the minimizing uses a T-join implementation.

4. The method of claim 3, wherein the minimizing comprises transforming the T-join implementation by a minimum perturbation technique.

5. The method of claim 3, wherein the minimizing comprises transforming the T-join implementation is transformed by a minimum weight perfect matching technique.

6. The method of claim 1, wherein the assigning uses a depth-first search implementation.

7. The method of claim 1, wherein the assigning uses a breadth-first search implementation.

8. The method of claim 1, wherein the vertices represent a plurality of routing layers.

9. The method of claim 1, further comprising:
    assigning a second indicator to an other vertex in the minimized arrangement.

10. The method of claim 9, wherein the second indicator represents a second voltage potential.

11. A computer-readable medium having recorded thereon instructions executable by a processor to perform an assignment of alternating voltage potentials to a set of shield wires in a routing layer to of an integrated circuit, the instructions for:
    generating vertices representing the set of shield wires;
    dependent on the routine layer, generating between the vertices, the edges representing adjacency of the set of shield wires;
    determining whether any assignment of voltage potentials to the vertices results in an arrangement in which at least one of the edges is positioned between vertices of the same voltage potential;
    dependent on the determining, selectively minimizing the edges to obtain a minimized arrangement of edges; vertices and
    assigning a first indicator to at least one of the vertex in the minimized arrangement.

12. The computer readable medium of claim 11, wherein the first indicator represents a first voltage potential.

13. The computer-readable medium of claim 11, wherein the minimizing uses a T-join implementation.

14. The computer-readable medium of claim 13, wherein the minimizing comprises transforming the T-join implementation by a minimum perturbation technique.

15. The computer-readable medium of claim 13, wherein the minimizing comprises transforming the T-join implementation is transformed by a minimum weight perfect matching technique.

16. The computer-readable medium of claim 11, wherein the assigning uses a depth-first search implementation.

17. The computer-readable medium of claim 11, wherein the assigning uses a breadth-first search implementation.

18. The computer-readable medium of claim 11, wherein the vertices represent a plurality of routing layers.

19. The computer-readable medium of claim 11, further comprising instructions for:
    assigning a second indicator to an other vertex in the minimized arrangement.

20. The computer-readable medium of claim 19, wherein the second indicator represents a second voltage potential.

21. A computer system that determines alternating voltage potentials to a set of shield wires in a routing layer of an integrated circuit, comprising:
    a processor;
    a memory;
    a display device; and
    software instructions stored in the memory for enabling the computer system under control of the processor, to perform:
        generating vertices representing the set of shield wires;
        dependent on the routing layer, generating edges between the vertices, the edges representing adjacency of the set of shield wires;

determining whether any assignment of voltage potentials to the vertices results in an arrangement in which at least one of the edges is positioned between vertices of the same voltage potential;

dependent on the determining, selectively minimizing the edges to obtain a minimized arrangement of edges; vertices and assigning a first indicator to at least one of the vertex in the minimized arrangement.

22. The computer system of claim 21, wherein the first indicator represents a first voltage potential.

23. The computer system of claim 21, further comprising instructions for:

assigning a second indicator to an other vertex in the minimized arrangement.

24. A method for assigning alternating voltage potentials to a set of shield wires in a routing layer of an integrated circuit, comprising:

a step for generating vertices representing the set of shield wires;

dependent on the routing layer, a step for generating edges between the vertices, the edges representing adjacency of the set of shield wires;

a step for determining whether any assignment of voltage potentials to the vertices results in an arrangement in which at least one of the edges is positioned between vertices of the same voltage potential;

dependent on the determining, a step for selectively minimizing edges to obtain a minimized arrangement of edges; vertices and a step for assigning a first indicator to at least one of the vertex in the minimized arrangement.

25. An apparatus for assigning alternating voltage potentials to a set of shield wires in a routing layer of an integrated circuit, comprising:

means for generating vertices representing the set of shield wires;

dependent on the routing layer, means for generating edges between the vertices, the edges representing adjacency of the set of shield wires;

means for determining whether any assignment of voltage potentials to the vertices results in an arrangement in which at least one of the edges is positioned between vertices of the same voltage potential;

dependent on the determining, means for selectively minimizing the edges to obtain a minimized arrangement of edges; vertices and means for assigning a first indicator to at least one of the vertex in the minimized arrangement.

* * * * *

UNITED STATES PATENT AND TRADEMARK OFFICE
CERTIFICATE OF CORRECTION

PATENT NO. : 6,779,166 B2
DATED : August 17, 2004
INVENTOR(S) : Devendra Vidhani It is certified that error appears in the above-identified patent and that said Letters Patent is hereby corrected as shown below:

Column 7,
Line 54, after the second appearance of the word "edges" delete ";"
Line 55, before the word "vertices" insert -- and -- and after the word "vertices" insert -- ; --

Column 8,
Line 18, insert the word -- edge -- after the word "generating"
Line 27, after the second appearance of the word "edges" delete ";"
Line 28, before the word "vertices" insert -- and -- and after the word "vertices" insert -- ; --
Line 51, replace the words "an" and "other" with -- another --

Column 9,
Line 6, after the second appearance of the word "edges" delete ";"
Line 7, before the word "vertices" insert -- and -- and after the word "vertices" insert -- ; --
Line 14, replace the words "an" and "other" with -- another --

Column 10,
Lines 5 and 22, after the word "edges" replace ";" with -- and -- and after the word "vertices" insert -- ; --

Signed and Sealed this

Thirtieth Day of November, 2004

JON W. DUDAS
*Director of the United States Patent and Trademark Office*